United States Patent [19]

Matsuda

[11] Patent Number: 5,608,238
[45] Date of Patent: Mar. 4, 1997

[54] SEMICONDUCTOR DEVICE HAVING TWO INSULATED GATES AND CAPABLE OF THYRISTOR FUNCTION AND METHOD FOR OPERATING THE SAME

[75] Inventor: Hideo Matsuda, Yokohama, Japan

[73] Assignee: Kabushiki Kaisha Toshiba, Kawasaki, Japan

[21] Appl. No.: 544,918

[22] Filed: Oct. 18, 1995

Related U.S. Application Data

[63] Continuation of Ser. No. 210,946, Mar. 21, 1994, abandoned.

[30] Foreign Application Priority Data

Jun. 14, 1993 [JP] Japan ..................................... 5-141799

[51] Int. Cl.$^6$ ............................ H01L 29/74; H01L 31/111
[52] U.S. Cl. ......................... 257/140; 257/133; 257/139; 257/146; 257/147; 257/149; 257/155
[58] Field of Search ..................................... 257/133, 139, 257/140, 146, 147, 149, 155, 341

[56] References Cited

U.S. PATENT DOCUMENTS

| | | | |
|---|---|---|---|
| 5,281,833 | 1/1994 | Ueno | 257/147 |
| 5,286,981 | 2/1994 | Lilja et al. | 257/132 |

FOREIGN PATENT DOCUMENTS

| | | | |
|---|---|---|---|
| 0159663 | 10/1985 | European Pat. Off. | 257/330 |
| 0540017 | 5/1993 | European Pat. Off. | 257/147 |

OTHER PUBLICATIONS

IEEE, from Proceeding of Power Electronics Specialists Conference, Tetsujiro Tsunoda, et al., "Improved 600V and 1200V IGBT with Low Turn–off Loss and High Ruggedness", pp. 66–73, Jun. 10–15, 1990.

IEEE Ch2987–61/91/0000–0138, M. Nandakumar, et al., "The Base Resistance Controlled Thyristor (BRT) A New MOS Gated Power Thyristor", pp. 138–141, 1991.

I.E.E.E. Transactions on Electron Devices, vol. 34, No. 5, May 1987, pp. 1170–1176, W. Seifert, et al., "An Fet–Driven Power Thyristor".

Primary Examiner—Steven H. Loke
Attorney, Agent, or Firm—Oblon, Spivak, McClelland, Maier & Neustadt, P.C.

[57] ABSTRACT

A semiconductor device and a method for operating the same includes a first P-type semiconductor layer and a first N-type semiconductor layer provided thereon. A plurality of second P-type semiconductor layers and a plurality of third P-type semiconductor layers are formed on the surface of the first N-type semiconductor layer. A plurality of second N-type semiconductor layers are formed on their respective surfaces of the third P-type semiconductor layers. Emitter electrodes are provided on the second P-type semiconductor layers and second N-type semiconductor layers. A plurality of first gate electrodes is each provided above the first N-type semiconductor layer between the adjacent third P-type semiconductor layers. A plurality of second gate electrodes are each provided above the first N-type semiconductor layer between the second P-type semiconductor layer and the third P-type semiconductor layer. A collector electrode is provided under the first P-type semiconductor layer. If the timing at which a bias is applied to the first gate electrodes and second gate electrodes is controlled, an operation mode in which the device serves as a thyristor and an operation mode in which the device serves as an IGBT can be switched to each other. Therefore, the semiconductor device, which can be turned on/turned off, is capable of being turned off at high speed when an on-state voltage is low.

8 Claims, 7 Drawing Sheets

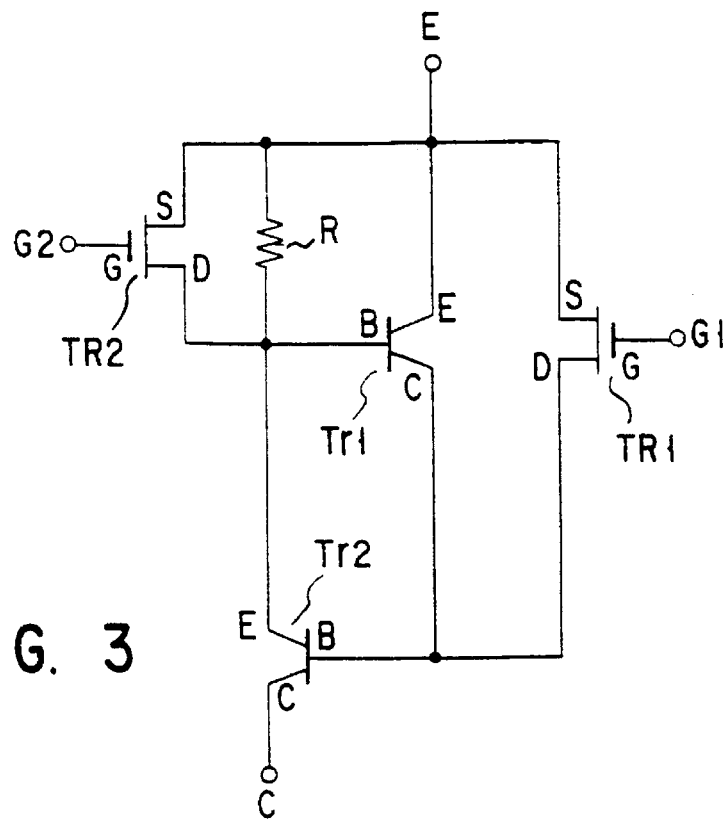
F I G. 3
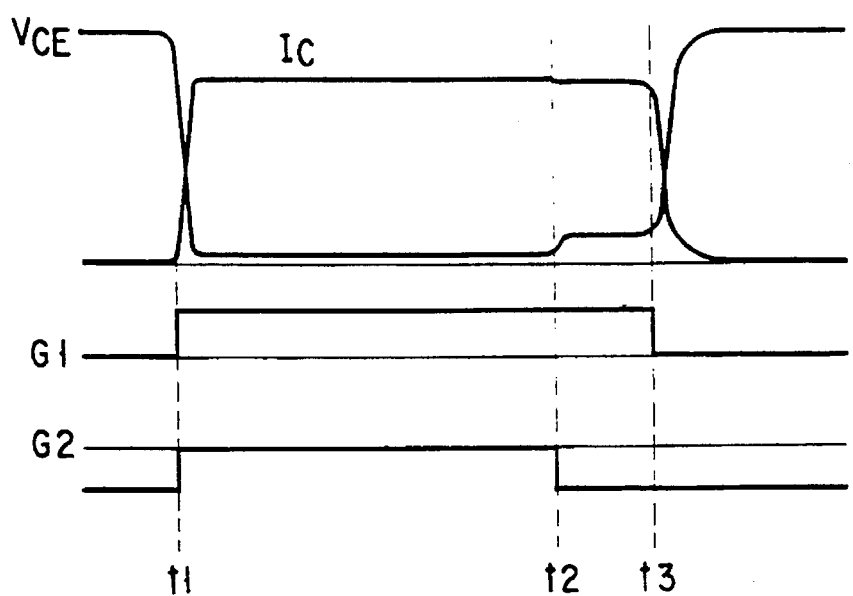
F I G. 4

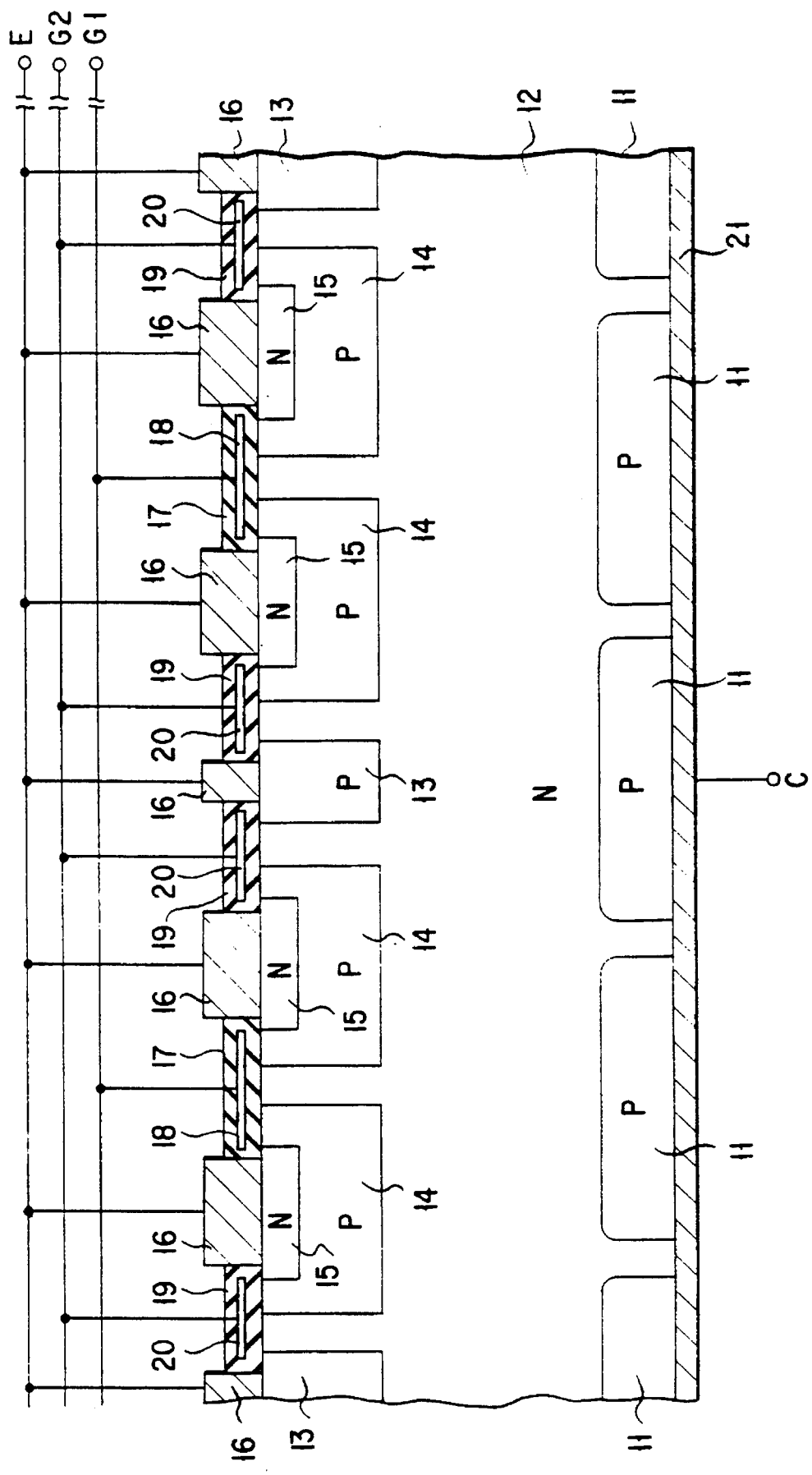
F I G. 5

SEMICONDUCTOR DEVICE HAVING TWO INSULATED GATES AND CAPABLE OF THYRISTOR FUNCTION AND METHOD FOR OPERATING THE SAME

This application is a Continuation of application Ser. No. 08/210,946, filed on Mar. 21, 1994, now abandoned.

BACKGROUND OF THE INVENTION

1. Field of the Invention

The present invention relates to a semiconductor device such as a power device which can be turned off by controlling a gate, and a method for operating the same.

2. Description of the Related Art

An IGBT (Insulated Gate Bipolar Transistor), which is described in 1990 IEEE PESC (Proceedings of Power Electronics Specialists Conference), Jun. 10–15, 1990, pp. 9–16, and a BRT (Base Resistance Controlled Thyristor), which is described in 1991 IEEE ISPSD (Proceedings of the 3rd International Symposium on Power Semiconductor Devices and ICs), Apr. 22–24, 1991, pp. 138–141, have recently been employed as a power device capable of being turned on/turned off by controlling a gate.

However, the IGBT and BRT have the following drawbacks. Though the IGBT can be turned on/turned off at high speed, its on-state voltage is increased in a large-current region. Though the on-state voltage of the BRT is not so high in a large-current region, its turn-off time is long and its turn-off capability is low.

SUMMARY OF THE INVENTION

An object of the present invention is to provide a semiconductor device whose on-state voltage is low in a large-current region, whose controllable turn-off current is large and which can be turned off at high speed, and a method for operating the same.

According to one aspect of the present invention, there is provided a semiconductor device, comprising:

at least one first semiconductor region of a first conductivity type having a first surface and a second surface;

a second semiconductor region of a second conductivity type provided on the first surface of the first semiconductor region;

a plurality of third semiconductor regions of the first conductivity type provided on a surface of the second semiconductor region;

a plurality of fourth semiconductor regions of the first conductivity type provided on the surface of the second semiconductor region;

a plurality of fifth semiconductor regions of the second conductivity type provided on respective surfaces of the plurality of fourth semiconductor regions;

a plurality of first electrodes located on the plurality of third semiconductor regions and the plurality of fifth semiconductor regions and electrically connected to each other;

a plurality of second electrodes each provided in a gate insulating film interposed between adjacent fourth semiconductor regions;

a plurality of third electrodes each provided in a gate insulating film located above adjacent second and third semiconductor regions; and a fourth electrode provided on the second surface of the first semiconductor region.

According to another aspect of the present invention, there is provided a method for operating a semiconductor device comprising:

at least one first semiconductor region of a first conductivity type having a first surface and a second surface;

a second semiconductor region of a second conductivity type provided on the first surface of the first semiconductor region;

a plurality of third semiconductor regions of the first conductivity type provided on a surface of the second semiconductor region;

a plurality of fourth semiconductor regions of the first conductivity type provided on the surface of the second semiconductor region;

a plurality of fifth semiconductor regions of the second conductivity type provided on respective surfaces of the plurality of fourth semiconductor regions;

a plurality of first electrodes located on the plurality of third semiconductor regions and the plurality of fifth semiconductor regions and electrically connected to each other;

a plurality of second electrodes each provided in a gate insulating film interposed between adjacent fourth semiconductor regions;

a plurality of third electrodes each provided in a gate insulating film located above adjacent second and third semiconductor regions; and a fourth electrode provided on the second surface of the first semiconductor region, and wherein a voltage is applied to the plurality of second electrodes to form channel layers of the second conductivity type on the surfaces of the fourth semiconductor regions; and a voltage is applied to the plurality of third electrodes for a predetermined period of time after the channel layers of the second conductivity type are formed on the surfaces of the fourth semiconductor regions, thereby to form a channel layer of the first conductivity type on the surface of the second semiconductor region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a diagram showing an equivalent circuit of the power device of FIG. 1;

FIG. 4 is a timing chart for explaining a method for operating the power device shown in FIG. 1;

FIG. 5 is a cross-sectional view of the main part of a power device according to another embodiment of the present invention, wherein a first N-type semiconductor layer is partially connected to a collector electrode;

DETAILED DESCRIPTION OF THE PREFERRED EMBODIMENTS

An embodiment of the present invention will now be described, with reference to the accompanying drawings.

Figure 1:
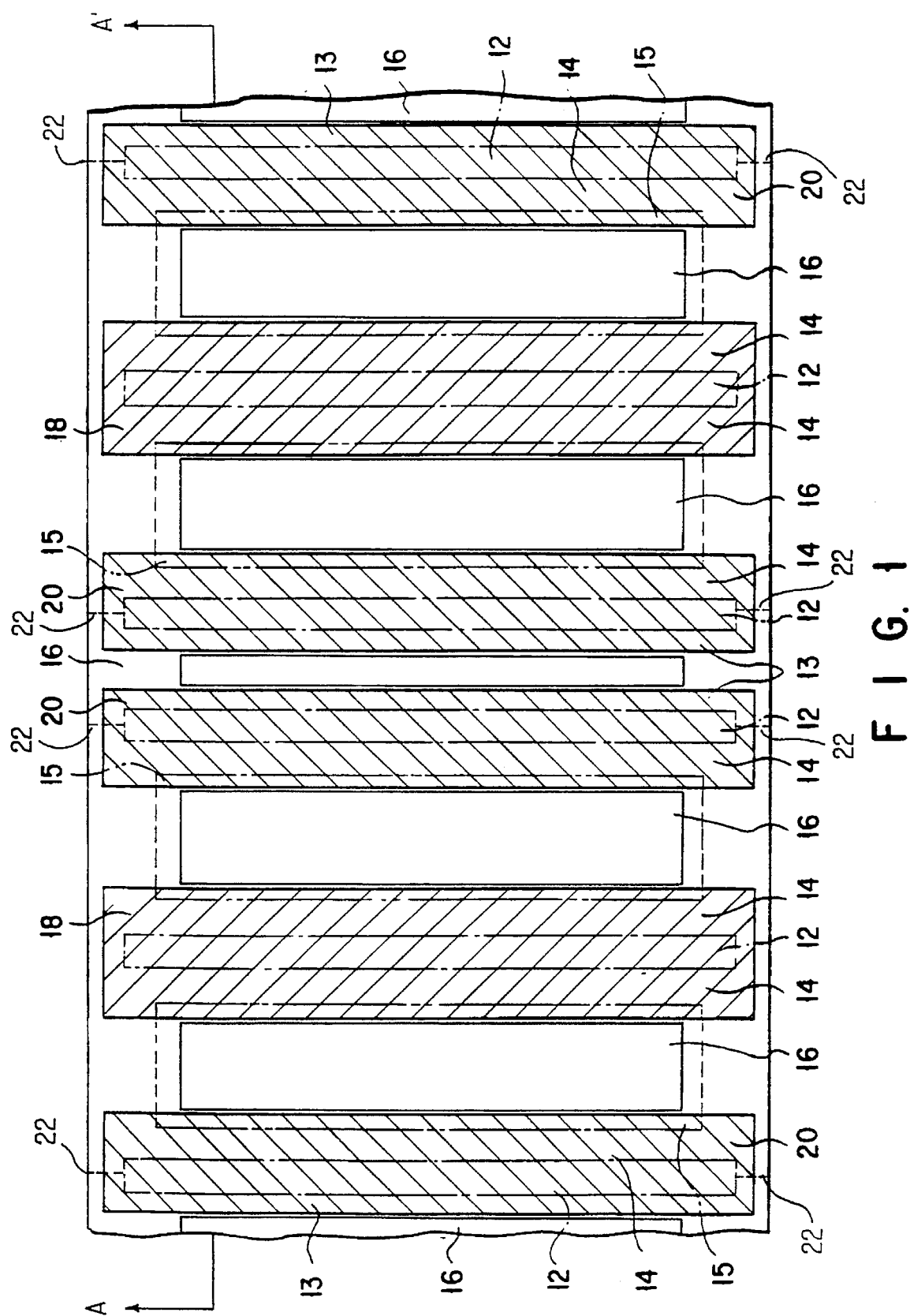
FIG. 1 is a plan view showing a constitution of a power device according to one embodiment of the present invention.
Figure 2:
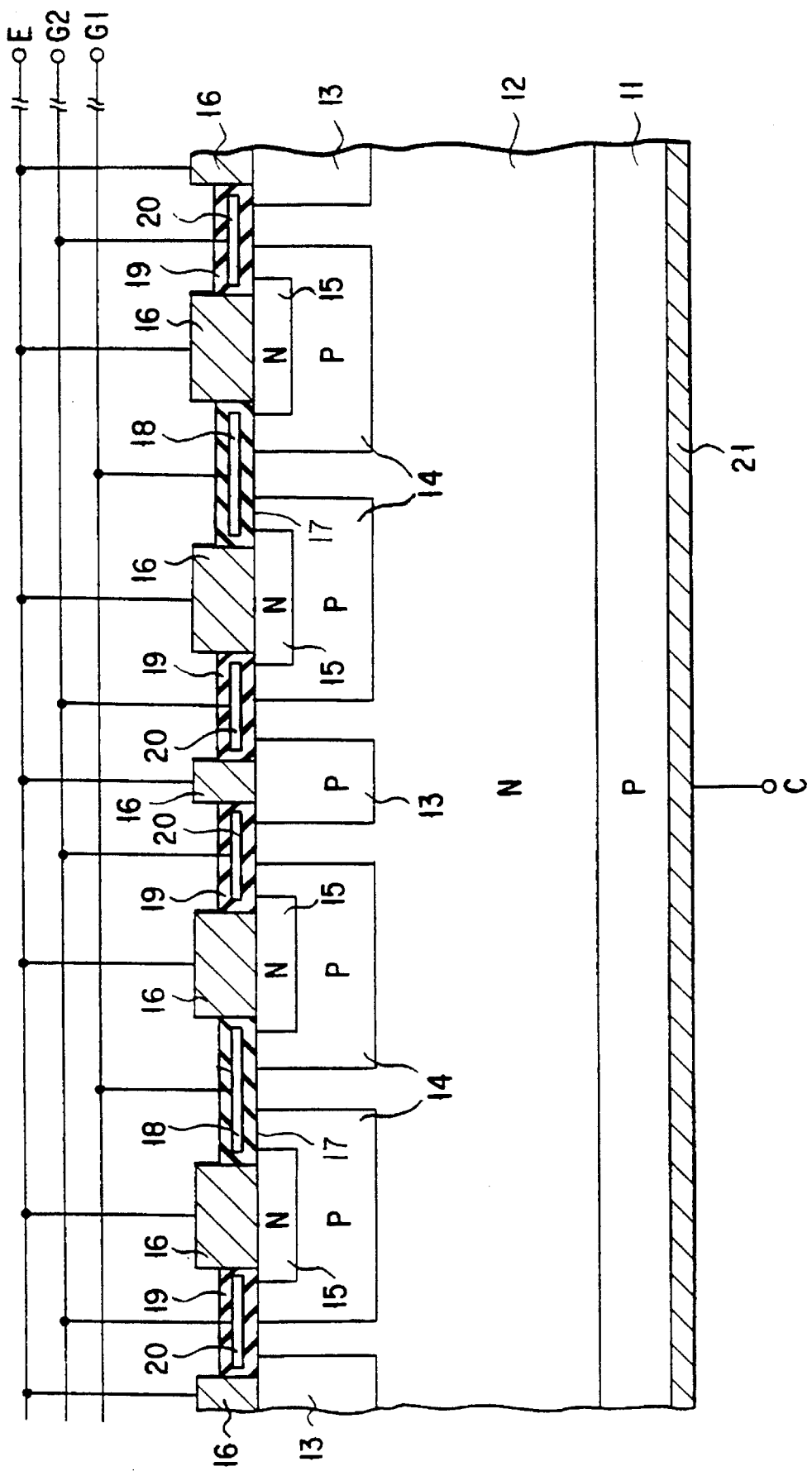
FIG. 2 is a cross-sectional view along line A–A' shown in FIG. 1 and shows the main part of the power device shown in FIG. 1.

FIGS. 1 and 2 schematically show a constitution of a power device of the present invention. FIG. 1 is a plan view of the power device, and FIG. 2 is a cross-sectional view along line A–A' in FIG. 1.

For example, the power device shown in FIGS. 1 and 2 includes a first P-type semiconductor layer (first semiconductor region of a first conductivity type) 11, a first N-type semiconductor layer (second semiconductor region of a second conductivity type) 12 provided on the layer 11, a plurality of second P-type semiconductor layers (third semiconductor regions of the first conductivity type) 13 and a plurality of third P-type semiconductor layers (fourth semiconductor regions of the first conductivity type) 14 disposed in the surface of the layer 12, and a plurality of second N-type semiconductor layers (fifth semiconductor regions of the second conductivity type) 15 disposed in respective surfaces of the layers 14.

The second and third P-type semiconductor layers 13 and 14 are located in such a manner that two layers 14 are interposed between the layers 13. These layers 13 and 14, which are adjacent each other, are connected to each other through portions 22, shown in FIG. 1.

An emitter electrode (first electrode) 16 is provided on each of the surfaces of the second P-type semiconductor layers 13 and the second N-type semiconductor layers 15.

An oxide film (gate insulating film) 17 is provided between the emitter electrodes 16 and on the surfaces of the first N-type semiconductor layer 12, third P-type semiconductor layer 14, and second N-type semiconductor layer 15, and a first gate electrode (second electrode) 18 is provided in the oxide film 17.

An oxide film (gate insulating film) 19 is provided between the emitter electrodes 16 and on the surfaces of the first N-type semiconductor layer 12, second P-type semiconductor layer 13, third P-type semiconductor layer 14, and second N-type semiconductor layer 15. A second gate electrode (third electrode) 20 is provided in the oxide film 19.

A collector electrode (fourth electrode) 21 is provided on the undersurface of the first P-type semiconductor layer 11.

The emitter electrodes 16 are made of metal, such as aluminum, and partially connected to each other. A voltage is applied from a terminal E to each of the emitter electrodes 16.

The first gate electrodes 18 are made of, for example, polysilicon, and biased by a terminal G1. The second gate electrodes 20 are formed of, or example, polysilicon, and biased by a terminal G2.

The collector electrode 21 is made of metal, such as aluminum. A voltage is applied from a terminal C to the collector electrode 21.

P-type impurities such as boron (B) are added to the silicon of the first P-type semiconductor layer 11, with an impurity concentration of about $1 \times 10^{19}/cm^3$. N-type impurities such as phosphorus (P) are added to the silicon of the first N-type semiconductor layer 12, and the resistivity thereof is about 100 Ωcm. The impurity concentration of the first N-type semiconductor layer 12 is, for example, $3 \times 10^{13}/cm^3$ or less.

P-type impurities such as boron (B) are added to the silicon of the second P-type semiconductor layers 13, and the impurity concentration is about $6 \times 10^{17}$ to $1 \times 10^{19}/cm^3$.

P-type impurities such as boron (B) are added to the silicon of the third P-type semiconductor layers 14, and the impurity concentration is about $1 \times 10^{17}$ to $5 \times 10^{17}/cm^3$.

The reason why the impurity concentration in the third semiconductor region 13 is higher than the impurity concentration in the fourth semiconductor region 14 will now be explained. When the first gate electrode is biased through terminal G1 at times t1, t2 and t3, the resistance is decreased in an N-type inverted channel layer (not shown) formed in the surface region of layer 14 between layers 12 and 15, and the device easily turns on. Similarly, current flows more easily through the connector 21, layers 11, 12 and 14, the P-type inverted channel layer (not shown) layer 13 and the emitter electrode 16, and the device is easily turned off.

N-type impurities such as arsenic (As) are added to the silicon of the second N-type semiconductor layers 15, and the impurity concentration is about $1 \times 10^{20}/cm^3$.

In this embodiment, the first P-type semiconductor layer 11, first N-type semiconductor layer 12, second P-type semiconductor layers 13, third P-type semiconductor layers 14, second N-type semiconductor layers 15, and electrodes 16, 18, 20 and 21 constitute one unit, and this unit is repeated as shown in FIG. 2.

FIG. 3 shows an equivalent circuit of the above-described power device in schematic form.

Referring to FIG. 3, the sources S (or drains D) of MOS transistors TR1 and TR2, the emitter E of an NPN transistor Tr1, and one end of a resistor R are connected to a terminal E. The collector C of a PNP transistor Tr2 is connected to a terminal C.

The gate G of the MOS transistor TR1 is connected to a terminal G1. The drain D (or source S) of the MOS transistor TR1 is connected to the collector C of the NPN transistor Tr1 and the base B of the PNP transistor Tr2.

The gate G of the MOS transistor TR2 is connected to a terminal G2. The drain D (or source S) of the MOS transistor TR2 is connected to the other end of the resistor R, the base B of the NPN transistor Tr1, and the emitter E of the PNP transistor Tr2.

The MOS transistor TR1 is constituted by the above-described first N-type semiconductor layer 12, third P-type semiconductor layers 14, and first gate electrode 18.

The MOS transistor TR2 is constituted by the above-described first N-type semiconductor layer 12, third P-type semiconductor layer 14, second N-type semiconductor layer 15, and second gate electrode 20.

The NPN transistor Tr1 is constituted by the first N-type semiconductor layer 12, third P-type semiconductor layer 14, and second N-type semiconductor layer 15.

The PNP transistor Tr2 is constituted by the first P-type semiconductor layer 11, first N-type semiconductor layer 12, and the second or third P-type semiconductor layer 13 or 14.

An operation of the power device having the above constitution will now be described, using the timing chart shown in FIG. 4.

For example, the first gate electrode 18 is biased by the terminal G1 at time t1. Then an N-type inverting channel layer (channel layer of a second conductivity type) is formed on the surface of the third P-type semiconductor layer 14.

As a voltage is applied between the terminals E and C, the electrons flow from the emitter electrode 16 to the collector electrode 21 through the second N-type semiconductor layer 15, N-type inverting channel layer, first N-type semiconductor layer 12, and first P-type semiconductor layer 11.

The holes flow from the collector electrode 21 to the emitter electrode 16 in the direction opposite to that of the electrons.

Therefore, a difference VCE in potential between the emitter E and collector C is suddenly reduced, but the device current Ic is increased.

By doing so, while the holes flow through the first P-type semiconductor layer 11, first N-type semiconductor layer 12, third P-type semiconductor layer 14, and second N-type semiconductor layer 15, the electrons flow through the second N-type semiconductor layer 15, third P-type semiconductor layer 14, first N-type semiconductor layer 12, and first P-type semiconductor layer 11. The device is thus latched up (turned on).

When only the first gate electrode 18 is biased, the device can be operated as a thyristor, with the result that the on-state voltage can be lowered in the thyristor mode.

After the time t1 at which the device is turned on, any bias need not be particularly applied to the first gate electrode 18. A voltage need not be applied because the device is in thyristor mode. The holes flow into layer 15 through layers 11, 12 and 14, while electrons flow in the opposite direction into layer 11 through layers 15, 14 and 12. Since the holes and electrons are flowing in opposite directions, no voltage need be applied to the first gate electrode 18. In effect, the device maintains an on-state even though no bias is applied.

The first gate electrode 18 is biased in order to form the N-type inverting channel layer on the surface of the third P-type semiconductor layer 14. In this state, the second gate electrode 20 is biased by the terminal G2.

Thus a P-type inverting channel layer (channel layer of a first conductivity type) is formed on the surface of the first N-type semiconductor layer 12 between the second and third P-type semiconductor layers 13 and 14.

The holes flow from the collector electrode 21 to the emitter electrode 16 through the first P-type semiconductor layer 11, first N-type semiconductor layer 12, third P-type semiconductor layer 14, P-type inverting channel layer, and second P-type semiconductor layer 13 during a period of time (between t2 and t3) continuing until the bias applied to the first gate electrode 18 is cut off.

The electrons flow from the emitter electrode 16 to the collector electrode 21 through the second N-type semiconductor layer 15, N-type inverting channel layer, first N-type semiconductor layer 12, and first P-type semiconductor layer 11.

When the first and second gate electrodes 18 and 20 are biased at the same time, the device can be operated as a normal IGBT (in an IGBT mode). For this reason, if the bias is prevented from being applied to the first gate electrode 18, the IGBT can be turned off after time t3, with the result that the controllable turn-off current of the device is increased, and the device can be turned off at high speed.

Other embodiments of the present invention will now be described, with reference to the accompanying drawings.

FIG. 5 shows a constitution of a power device which differs from that of FIG. 2 in that the first P-type semiconductor layer 11 and the first N-type semiconductor layer 12 are partially connected to the collector electrode 21. More specifically, the first P-type semiconductor layer 11 is divided into a plurality of regions, and each of the regions is connected to the collector electrode 21. The first N-type semiconductor layer 12 is also connected to the collector electrode 21 through gaps between the regions. The constitution shown in FIG. 5 increases the turn-off switching speed for discharge of carriers.

Figure 6:
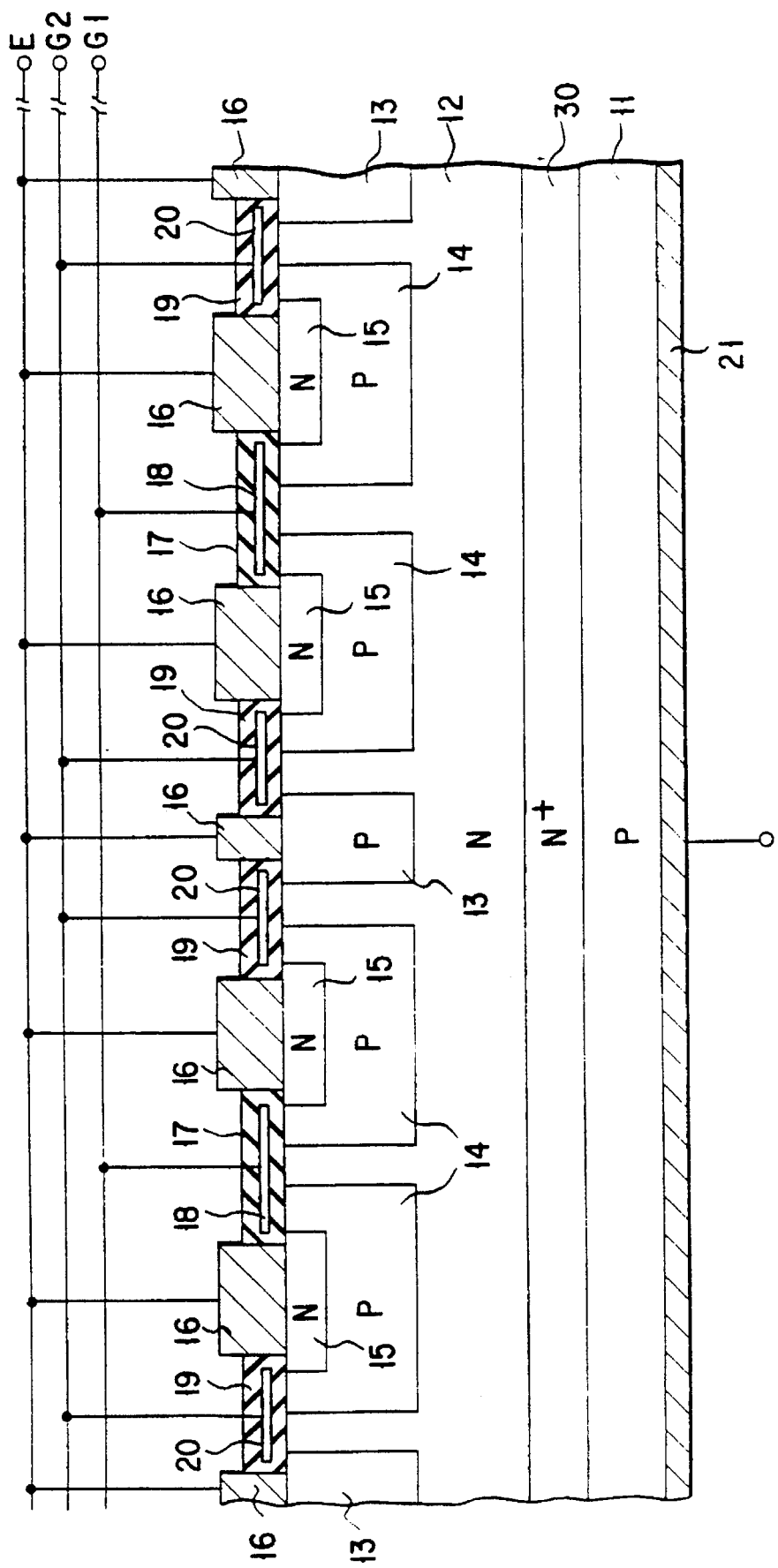
FIG. 6 is a cross-sectional view showing the main part of a power device according to still another embodiment of the present invention, wherein an $N^+$ layer whose concentration is higher than that of the first N-type layer, is interposed between the first P-and N-type semiconductor layers.
Figure 7:
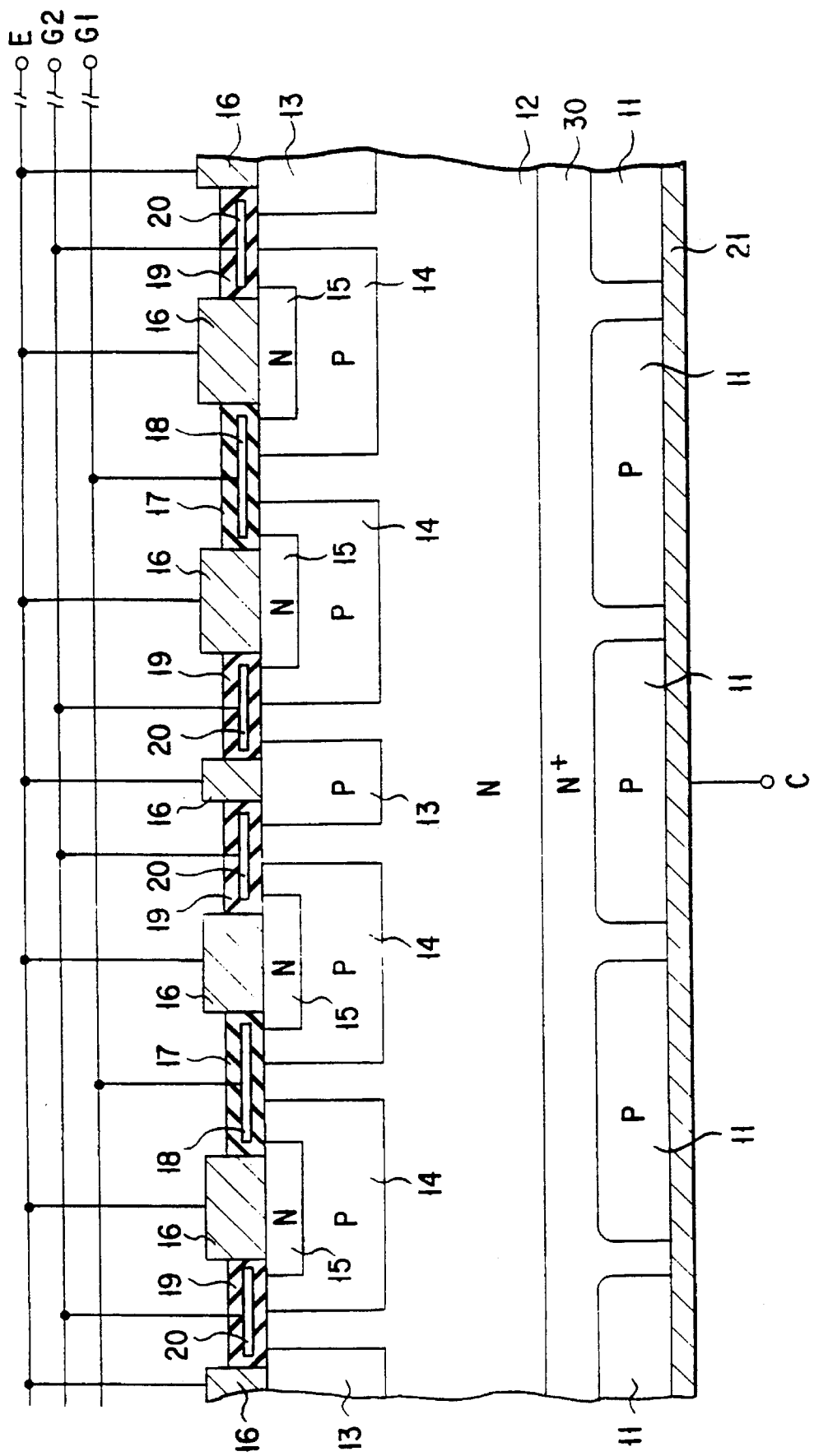
FIG. 7 is a cross-sectional view showing the main part of a power device according to still another embodiment of the present invention, wherein the $N^+$ layer is partially connected to the collector electrode.

FIG. 6 shows a constitution of a power device which differs from that of FIG. 2 in that an $N^+$ layer (sixth semiconductor region of the second conductivity type) 30, whose concentration (e.g., $1 \times 10^{16}/cm^3$) is higher than that of the first N-type semiconductor layer 12, is provided between the first P-type semiconductor layer 11 and first N-type semiconductor layer 12. While the device shown in FIG. 6 has the advantage of thin structure and good trade-off, it has the disadvantage of high costs. The high-impurity $N^+$ layer 30 can be partially connected to the collector electrode 21, as shown in FIG. 7.

Figure 8:
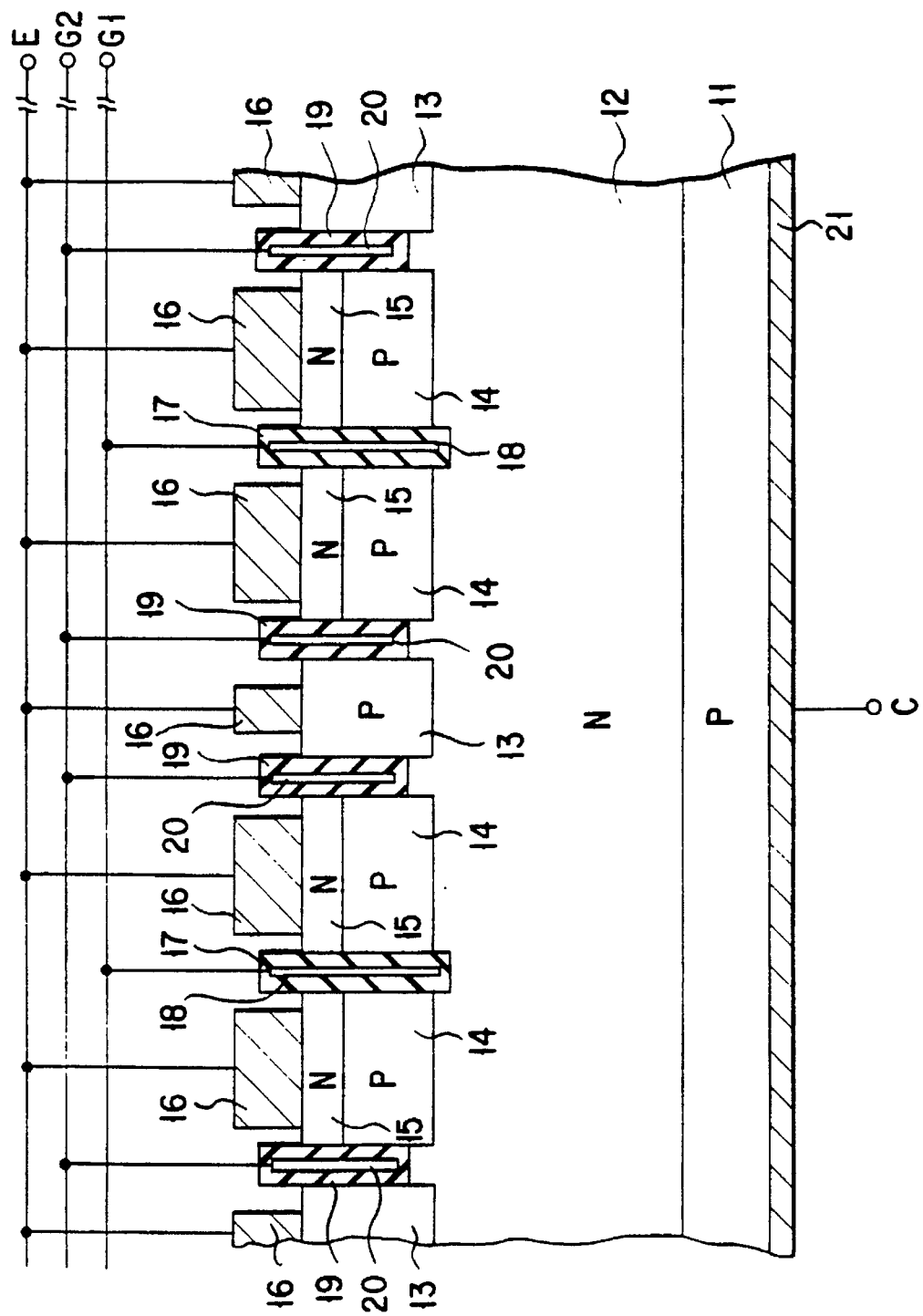
FIG. 8 is a cross-sectional view showing the main part of a power device according to yet another embodiment of the present invention, wherein first and second gate electrodes have a trench structure.

FIG. 8 shows a constitution of a power device which differs from that of FIG. 2 in that the first and second gate electrodes 18 and 20 have a so-called trench structure. In this constitution, the second N-type semiconductor layers 15 are formed on their corresponding third P-type semiconductor layers 14, and then trenches are formed along the longitudinal direction of the third P-type semiconductor layers 14 and second N-type semiconductor layers 15.

The oxide film 17 is provided in the trench formed between the adjacent layers 14 and 15, and the first gate electrode 18 is provided in the oxide film 17 in the longitudinal direction thereof. For example, the first gate electrode 18 extends to the first N-type semiconductor layer 12 below the third P-type semiconductor layer 14.

Further, the oxide film 19 is provided in the trench formed between the adjacent layers 13 and 14, and the second gate electrode 20 is provided in the oxide film 19 in the longitudinal direction thereof. For example, the second gate electrode 20 is formed within a range of the depths of the second P-type semiconductor layer 13 and third P-type semiconductor layer 14 in such a manner that a P-type inverting channel layer can be formed on the surface of the first N-type semiconductor layer 12. This constitution is effective in a high degree of integration.

The above-described power device according to the present invention can be operated in both the thyristor and IGBT modes. More specifically, two gate electrodes are formed, and the timing at which a bias is applied to these gate electrodes, is changed. Thus, the mode of the power device operated as a low on-state voltage thyristor and the mode of the power device operated as a normal IGBT having a large amount of current to be turned off at high speed, can be switched to each other. The turn-off capability can thus be improved, while keeping the on-state voltage low in the large-current region. Consequently, the on-state voltage is low and the controllable turn-off current is large. The power device can thus be turned off at high speed.

In the above embodiments, the present invention is described as a single power device. However, a plurality of power devices can be provided on the substrate in order to easily employ great power.

It is needless to say that various changes and modifications can be made without departing from the scope of the present invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a first semiconductor region of a first conductivity type having a first surface and a second surface;

a second semiconductor region of a second conductivity type provided on the first surface of said first semiconductor region;

a plurality of third semiconductor regions of the first conductivity type provided on a surface of said second semiconductor region;

a plurality of fourth semiconductor regions of the first conductivity type provided on the surface of said second semiconductor region and adjacent to said plurality of third semiconductor regions;

a plurality of fifth semiconductor regions of the second conductivity type provided on respective surfaces of said plurality of fourth semiconductor regions;

a plurality of first electrodes located on aid plurality of third semiconductor regions and said plurality of fifth semiconductor regions and electrically connected to each other;

a plurality of second electrodes including a first gate insulating film each provided between said plurality of first electrodes, at least above and between adjacent two of said plurality of fourth semiconductor regions, and on the surface of said second semiconductor region, said plurality of second electrodes being electrically connected to each other;

a plurality of third electrodes including a second gate insulating film each provided between said plurality of first electrodes, between one of said plurality of third semiconductor regions and an adjacent one of said plurality of fourth semiconductor regions, on the surface of said second semiconductor region and on said adjacent one of said plurality of fourth semiconductor regions, said plurality of third electrodes being electrically connected to each other and controlled independently of said plurality of second electrodes, at least one of said plurality of third semiconductor regions and at least one of said plurality of fourth semiconductor regions directly contacting each other at a common boundary therebetween in a vicinity of at least one end portion of at least one of said third electrodes; and a fourth electrode provided on the second surface of said first semiconductor region.

2. The semiconductor device according to claim 1, wherein said third semiconductor regions and said fourth semiconductor regions include impurities, and a concentration of the impurities of said third semiconductor regions is higher than that of the impurities of said fourth semiconductor regions.

3. The semiconductor device according to claim 1, wherein said second semiconductor region is partially connected to said fourth electrode.

4. The semiconductor device according to claim 1, further comprising a sixth semiconductor region of the second conductivity type between said first semiconductor region and said second semiconductor region, said sixth semiconductor region having an impurity concentration which is higher than that of said second semiconductor region.

5. The semiconductor device according to claim 4, wherein said sixth semiconductor region is partially connected to said fourth electrode.

6. The semiconductor device according to claim 1, further comprising a plurality of trenches provided along said fourth semiconductor regions and said fifth semiconductor regions, one of said second and third electrodes being formed in each of said trenches.

7. A semiconductor device comprising:

a first semiconductor region of a first conductivity type having a first surface and a second surface;

a second semiconductor region of a second conductivity type provided on the first surface of said first semiconductor region;

a plurality of third semiconductor regions of the first conductivity type provided on a surface of said second semiconductor region;

a plurality of fourth semiconductor regions of the first conductivity type provided on the surface of said second semiconductor region and adjacent to said plurality of third semiconductor regions;

a plurality of fifth semiconductor regions of the second conductivity type provided on respective surfaces of said plurality of fourth semiconductor regions;

a plurality of first electrodes located on said plurality of third semiconductor regions and said plurality of fifth semiconductor regions and electrically connected to each other;

a plurality of second electrodes including a first gate insulating film each provided between said plurality of first electrodes, at least above and between adjacent two of said plurality of fourth semiconductor regions, and on the surface of said second semiconductor region, said plurality of second electrodes being electrically connected to each other;

a plurality of third electrodes including a second gate insulating film each provided between said plurality of first electrodes, between one of said plurality of third semiconductor regions and an adjacent one of said plurality of fourth semiconductor regions, on the surface of said second semiconductor region and on said adjacent one of said plurality of fourth semiconductor regions, said plurality of third electrodes being electrically connected to each other and controlled independently of said plurality of second electrodes, at least one of said plurality of third semiconductor regions and at least one of said plurality of fourth semiconductor regions directly contacting each other at a common boundary therebetween in a vicinity of at least one end portion of at least one of said third electrodes; and a fourth electrode provided on the second surface of said first semiconductor region, wherein a first voltage is applied to said plurality of second electrodes to form first channel layers of the second conductivity type on the surfaces of said fourth semiconductor regions; and a second voltage is applied to said plurality of third electrodes for a predetermined period of time after the channel layers of the second conductivity type are formed on the surface of said fourth semiconductor regions, thereby to form second channel layers of the first conductivity type on the surface of said second semiconductor region.

8. The semiconductor device according to claim 7, wherein no voltage is applied to said second electrodes after the first channel layers of the second conductivity type are formed.

* * * * *